United States Patent [19]

Yamazaki et al.

[11] Patent Number: 4,725,558
[45] Date of Patent: Feb. 16, 1988

[54] SEMICONDUCTOR DEFECTS CURING METHOD AND APPARATUS

[75] Inventors: Shunpei Yamazaki, Tokyo; Kunio Suzuki; Mikio Kinka, both of Atsugi; Takeshi Fukada, Ebina; Masayoshi Abe, Tokyo; Ippei Kobayashi, Atsugi; Katsuhiko Shibata, Atsugi; Masato Susukida, Atsugi; Susumu Nagayama, Tokyo; Kaoru Koyanagi, Saku, all of Japan

[73] Assignee: Semiconductor Energy Laboratory Co., Ltd., Kanagawa, Japan

[21] Appl. No.: 927,501

[22] Filed: Nov. 6, 1986

[30] Foreign Application Priority Data

Nov. 6, 1985 [JP] Japan ................... 60-248640
Nov. 6, 1985 [JP] Japan ................... 60-248641

[51] Int. Cl.[4] .................................. H01L 31/18
[52] U.S. Cl. ..................................... 437/2; 437/4; 437/170; 437/228
[58] Field of Search ............... 29/572, 575, 584, 585; 136/290, 244, 258 AM; 427/74, 86; 156/659.1; 437/2, 4, 170, 228

[56] References Cited

U.S. PATENT DOCUMENTS

| 4,166,918 | 9/1979 | Nostrand et al. | 136/243 |
| 4,385,971 | 5/1983 | Swartz | 204/129.1 |
| 4,420,497 | 12/1983 | Tickle | 427/8 |
| 4,451,970 | 6/1984 | Izu et al. | 29/574 |
| 4,464,823 | 8/1984 | Izu et al. | 29/572 |
| 4,466,992 | 8/1984 | Dreiling | 427/39 |
| 4,543,171 | 9/1985 | Firester et al. | 204/129.3 |
| 4,544,797 | 10/1985 | Hewig | 136/249 |
| 4,640,002 | 2/1987 | Phillips et al. | 29/574 |

FOREIGN PATENT DOCUMENTS

| 55-74544 | 6/1980 | Japan | 29/575 |
| 59-35490 | 2/1984 | Japan | 136/290 |
| 60-37165 | 2/1985 | Japan | 29/575 |
| 60-85578 | 5/1985 | Japan | 136/290 |

Primary Examiner—Aaron Weisstuch
Attorney, Agent, or Firm—Gerald J. Ferguson, Jr.; Michael P. Hoffman; Michael J. Foycik, Jr.

[57] ABSTRACT

An improved semiconductor defects curing method and apparatus are disclosed which is free from current leakage due to pin-holes or other defects. Also an improved method for processing a semiconductor device is shown. According to the invention, the gaps or holes in the semiconductor layer produced in the fabrication process are filled with insulator in advance of deposition of electrodes.

4 Claims, 11 Drawing Figures

SEMICONDUCTOR DEFECTS CURING METHOD AND APPARATUS

BACKGROUND OF THE INVENTION

This invention relates to a semiconductor defects curing method and apparatus in which the performance of the semiconductor device is improved. More particularly, this invention relates to measures for eliminating disadvantages caused by the effect of electrical shorts and shunts due to pinholes or other gaps created during the fabrication process of the device.

Recently, considerable efforts have been made to develop systems for depositing amorphous semiconductor alloys, each of which can encompass relatively large areas, and which can be doped to form p-type and n-type materials for the production of p-i-n and other type devices which are, in photovoltaic and other applications, substantially equivalent to their crystalline counterparts. As such a device, there are disclosed improved photoelectric cells in Japanese patent published application Nos. Sho 55-4994, 55-124274, 56-13777, 56-13778, and 56-13779.

One example of a prior art photovoltaic device is shown in FIG. 1. In the figure, a transparent conductive film 2 is formed on a glass substrate 1 with a mask aligned above the substrate 1. Semiconductor layers 3 are deposited on the substrate 1 with the conductive film 2 therebetween with a mask aligned above the substrate 1. Further, on the substrate 1 with the conductive film 2 and the semiconductor layers 3, aluminum layers 4 are formed as second electrodes with a mask. Reference numerals 31 and 11 designate respective photoelectric cells in the figure.

The two cells 31 and 11 are connected in series by means of a connection 12. In the connection 12 the second electrode 38 is made to be in contact with the first electrode 37. Although the figure appears only with two such connections, a number of the cells are connected with each other in series. The integrated photovoltaic device tends to be degraded after thermal treatment at 150° C. for tens of hours. The reason for the degradation is attributed to a reaction between the aluminum layer 4 and the semiconductor layer 3. Such a device is not suitable for outdoor use where the device is likely to be subjected to a high temperature ambient.

To eliminate the adverse reaction, use is made of a double-layered electrode as the second electrode, composed of a conductive transparent layer such as an ITO film below the aluminum electrode, the ITO film being free from reaction with the aluminum layer or the semiconductor layer. The conductive transparent electrode, however, tends to be finely deposited throughout the semiconductor including pinholes, gaps, or the like type defects introduced during fabrication processing. The transparent electrode material in the defects constitutes short current paths either as deposited or after fabrication. Because of this, only photovoltaic devices having narrow converting areas such as of 1 cm ×4 cm are currently available.

One attempt to eliminate short current circuit paths within amorphous semiconductor photovoltaic devices involves the application of a reverse bias voltage to the device. This applied reverse bias causes large currents to flow through the short circuit current paths causing localized heating of the current paths. The localized heating crystallizes the amorphous semiconductor in the region of the short circuit current paths, thereby resulting in an increase in the resistivity of the paths. Unfortunately, this process has many limitations. The resistivity of the path remains less than the resistivity of the unheated amorphous semiconductor device area, even after having been increased by the concentrated current. As a result, the short circuit current paths are not eliminated, but merely have their resistivity changed to a limited extent. Also this method is not effective for eliminating short circuit current paths resulting from substrate surface irregularities which can be a most prevalent cause of short circuit current paths, especially in large area devices having a roughened substrate surface forming a diffuse back reflector.

SUMMARY OF THE INVENTION

It is therefore an object of the invention to provide an improved semiconductor defects curing method in which adverse short circuits are effectively eliminated.

It is another object of the invention to provide an improved semiconductor defects curing method and apparatus in which undesirable shunts are eliminated with only a simple procedure.

It is a further object of the invention to provide an improved semiconductor defects curing method and apparatus which can be used with an effective roughened large area and without causing short circuit current paths.

DETAILED DESCRIPTION OF THE PREFERRED EMBODIMENTS

Figure 1:
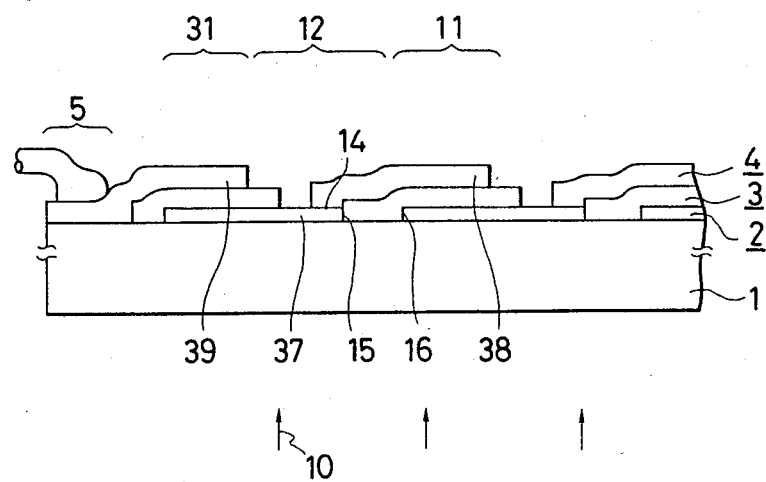
FIG. 1 is a fragmentary, cross sectional view of a prior art solar cell.

Referring to FIGS. 2(A) to 2(D), an embodiment of the invention is illustrated. On a substrate 1 such as a glass pane 1.2 mm thick×10 cm long×10 cm wide is formed a conductive transparent film 2, e.g., a laminated film of an ITO layer 1500 angstroms thick on a $SnO_2$ layer 200 to 400 angstroms thick or a transparent film mainly composed of tin oxide or tin nitride doped with a halogen. The film may be fabricated by a LPCVD method, a plasma CVD method, a spraying method, a sputtering method, and an ECR method.

The conductive film 2 is divided into a plurality of sections by patterned grooves 13 which are formed by a laser beam of 1.06 micrometers wavelength or 0.53 micrometers wavelength from a YAG laser 13 controlled by a microcomputer.

The patterned grooves 13 are 50 micrometers wide and 10 cm long by which each section is partitioned from others each with 10 to 20 mm width. On this film a nonmonocrystal layer 3 is formed with a p-n junction or p-i-n junction and with 0.2 to 1.0 micrometer thickness, more preferably 0.5 to 0.7 micrometer thickness. A preferred example is a laminated layer composed of a p-type semiconductor layer ($Si_xC_{1-x}$; $1>x>0$) 50 to 150 angstroms thick, an intrinsic amorphous or intrinsic semiamorphous silicon semiconductor layer 0.4 to 0.9 micrometer thick, and an n type layer 200 to 500 micro meters thick.

The semiconductor layer 3 formed with holes 6 and 6' is coated by a spinner or a coater with photocurable organic resin such that all the holes are filled completely with the resin. The organic resin may be a photoresist of positive type such as OFPR-800 distributed by Tokyo Ohka Kogyo Co., Ltd. or other known photoresist. For instance, an amount of photoresist is applied on the layer 3 to a thickness of 0.1 through 5.0 micrometers by spinning at 500 rpm for 5 seconds and thereafter at 2000 rpm for an hour, followed by a prebaking at 85° C. for 40 minutes. The photoresist layer is irradiated from the glass substrate side with ultraviolet light 17 having 300 to 400 nanometers wavelength. The ultraviolet light cannot penetrate the semiconductor layer 3 because of the absorption in the layer whereas the resin 7, 7' filling the holes 6 and 6' is selectively cured. In other words, the intensity and the wavelength are chosen so that the semiconductor layer 3 can function as a mask. Curing of OFPR-800 is carried out by irradiation of ultraviolet light of 6 mW/cm$^2$ for 5 seconds followed by aftertreatments. Then, the uncured resin is removed by rinsing with pure water for 10 minutes. The remaining cured resin in the holes is chemically stabilized by sinter and post-cure treatments. For instance, the layer is given post baking for an hour at 150° C. Thus, the stopping process is completed.

Figure 2A:
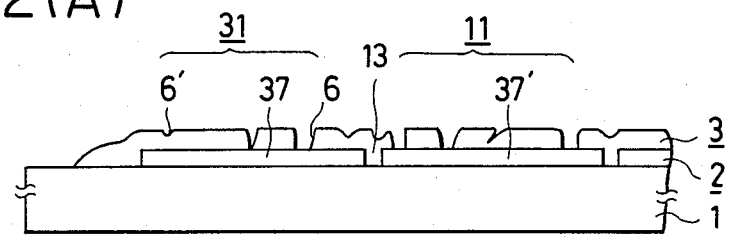
FIGS. 2(A) through 2(D) are fragmentary, cross sectional views showing another embodiment of the invention.
Figure 2B:
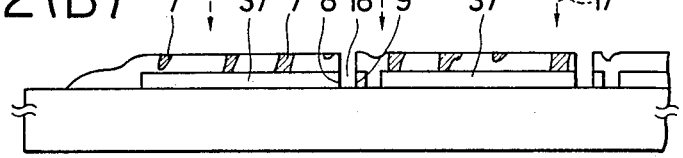
Figure 2C:
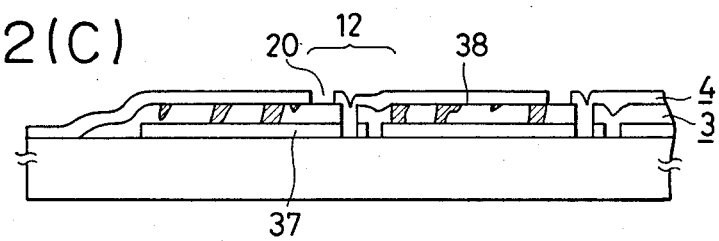

After stopping the holes, openings 18 are formed adjacent to the groove 13 as shown in FIG. 2(B) by means of laser scribing to provide an access to the first electrode 37 and 37'. Although the openings 18 reach the substrate 1 in the figure, they can be more shallow so as long as at least portions of the first electrodes 37 and 37' are exposed. A second electrode 4 consisting of a laminate of two conductive layers is deposited on the underlying laminated layers 2 and 3 and separated into portions by grooves 20 scribed by laser scribing.

The second electrode may also be a transparent conductive layer 300 to 500 angstroms thick, for example, made of ITO, $In_2O_3$, $SnO_2$, or ZnO through which incident light of long wavelength can pass out of the device.

Alternatively, the second electrode may be made reflective by deposition of aluminum, chromium, or silver as a single-layered reflective film, or aluminum and nickel on the transparent electrode film as a double-layered reflective film. In the latter embodiment, the second electrode is comprised of an ITO layer 1050 angstroms thick and an aluminum layer 1000 angstroms thick. The electrode can be formed by sputtering, electron beam deposition, or a plasma CVD method at less than 300° C. in order not to degrade the semiconductor.

Figure 2D:
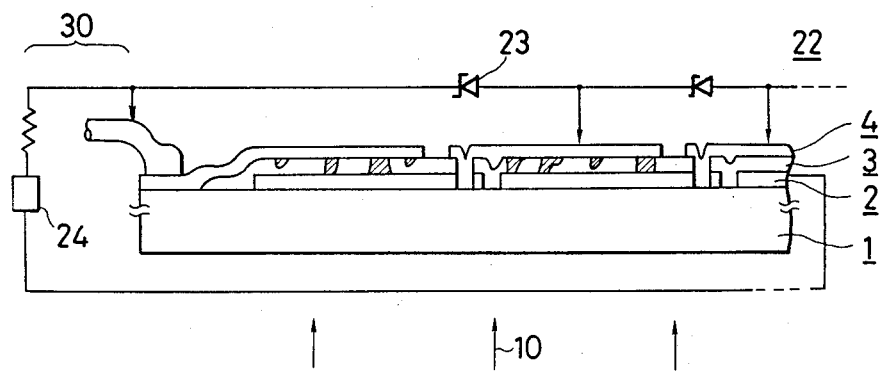
Figure 3:
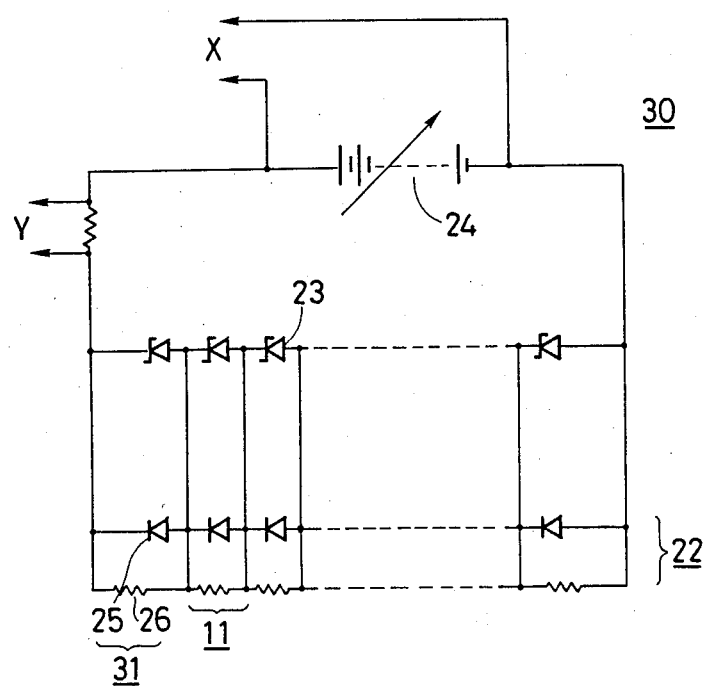
FIG. 3 is an equivalent circuit of another embodiment of the invention.

Referring to FIG. 2(D) and FIG. 3, a reverse bias applying circuit 22 is illustrated. The circuit comprises a power supply 24 and a number of zener diodes 23. Between each adjacent pair of diodes 23 and between the power supply 24 and the first or last diodes electrical contact is made with the first and second electrodes, respectively so that the power supply 24 output voltage is divided into the reverse bias voltages which are applied to each cell constituting the device. The reverse bias voltage must be less than the breakdown voltage of the p-i-n junction of the semiconductor layer 3. Because of this the reverse bias voltage does not cause current passage through flawless portions of the semiconductor layer 3. To further preclude breakdown of the p-i-n junction, the zener diodes are selected such that the zener voltage is slightly below the breakdown voltage of the p-i-n junction.

In FIG. 3, the circuit diagram includes the number of the cells constituting the device, each of which is represented by a diode 25 corresponding to the semiconductor layer 2 and a resistance 26 corresponding to the defects (holes) as leakage source. The zener diode 23 is connected in parallel to the diode and the resistance so that the voltage applied to the diode 25 is kept below the breakdown voltage thereof.

With the bias voltage less than the breakdown voltage, the holes or flaws in the semiconductor layer 3 filled with the organic resin become current passages which are heated as electric current flows therethrough. The electric power is sometimes less than that required for burning out the holes or flaws completely. To make the burning out easy, the substrate 1 is heated in advance together with the semiconductor to a temperature less than the temperature at which the semiconductor may be degraded, normally less than 150° C.

Figure 4:
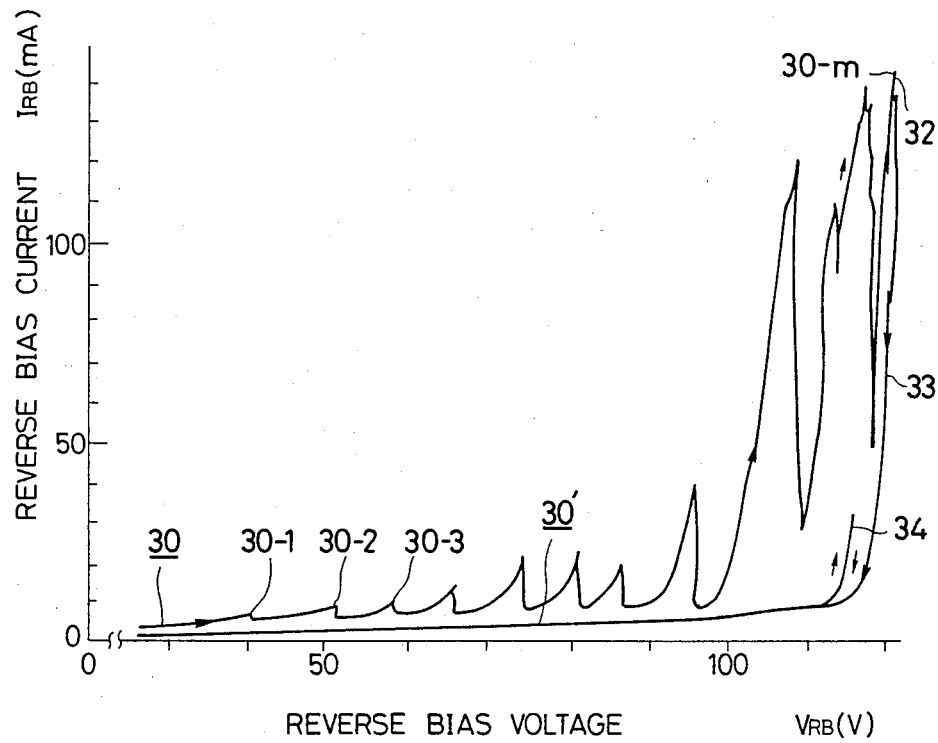
FIG. 4 is a graphical diagram showing the trend of reverse bias current in response to increasing reverse bias voltage.
Figure 5A:
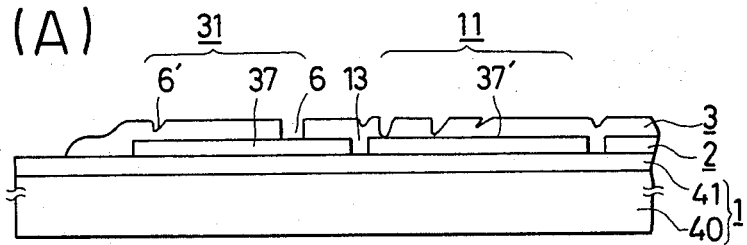
FIGS. 5(A) through 5(D) are fragmentary, cross sectional views showing a further embodiment of the invention.
Figure 5B:
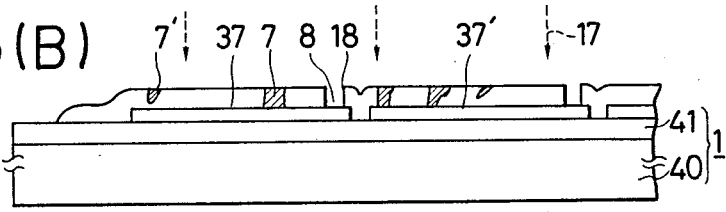
Figure 5C:
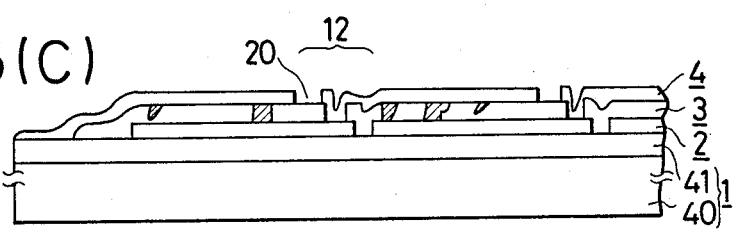
Figure 5D:
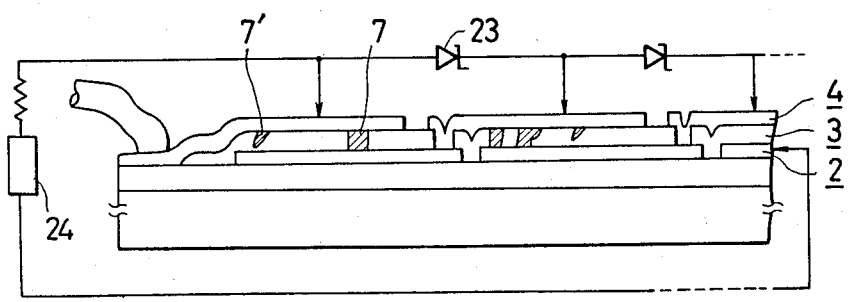

An experiment was made with a device having 15 cells connected with each other and the bias voltage was chosen at 120 V. As a result, the variation in current in response to increasing reverse bias voltage was obtained as shown in FIG. 4.

In the experiment, the reverse bias voltage increased from 0 to V to 120 V. A first leakage current was observed at 30-1. However, the leakage current decreased because of defects burning out due to the concentrated current flow. As the reverse bias voltage increased, a number of current ripples were observed. The magnitude of the leakage current became larger at the higher reverse bias voltages. With the reverse bias voltage decreasing from a point 32 (through point 33), the reverse bias current smoothly dropped without leakage current.

For reference, the device thus treated was subjected to increasing reverse bias voltage. No leakage current, however, was observed until the reverse current increased at the breakdown voltage (point 34).

After removing the bias applying circuit, the device, integrated on a 10 cm × 10 cm panel, was irradiated with light of 100 mW/cm$^2$ (AM1). The characteristics obtained were:

open-circuit voltage: 12.934 V
fill factor: 0.6641
short-circuit current: 79.34 mA
current density: 17.290 mA/cm$^2$
efficiency: 9.90%

With the device fabricated according to the process identical to that of the preceding in FIG. 2 but without reverse bias curing, the following experimental data 1 were obtained, and without the hole filling process and reverse bias curing, the following experimental data 2 were obtained:

|  | data 1 | data 2 |
|---|---|---|
| open circuit voltage: | 12.315 V | 11.49 V |
| fill factor: | 0.597 | 0.471 |
| short-circuit current: | 79.34 mA | 53.7 mA |
| efficiency: | 8.33% | 4.43% |

Compared with the figures obtained with the initial embodiment, it is understood that the device having undergone the reverse bias voltage demonstrates further improved characteristics. The reason why the reverse bias curing is effective is considered to be that a chemical reaction between the resin and the semiconductor may produce a stable insulator tightly joined to the pin-holes.

Another embodiment of the invention is shown in FIGS. 5(A) through 5(D). In this embodiment, the process is similar to that of the preceding embodiment. Therefore, only different configurations are described where redundant explanation does not appear.

A substrate 1 is composed of a conductive heat resisting stainless steel foil 40 of 10 to 100 micrometers thickness and a heat resisting organic resin film or an inorganic insulator film such as of enamel 41 on the stainless foil 40. On the substrate 1, a first electrode 2 is formed, for example, made of a 200 angstroms thick chromium layer, a 200 to 400 angstroms thick silicon oxide layer over a 1500 angstroms thick aluminum layer, a 500 angstroms thick $Si_3N_4$ layer over a 1500 angstroms thick aluminum layer, or a 1500 to 2000 angstroms thick transparent conductive layer mainly composed of tin oxide or tin nitride doped with halogen.

After dividing the first electrode by means of grooves 13 as in the previous embodiment, a multilayered semiconductor layer 3 with a pn junction or pin junction composed, for example, of an n-type semiconductor layer of 200 to 500 thickness, an intrinsic amorphous or semiamorphous silicon semiconductor layer of 0.4 to 0.9 micrometers thickness, and a p-type semiconductor layer ($SixC_{l-x}$: $0<x<1$) of 50 to 150 angstroms thickness is formed on the substrate.

Then, after the hole filling process is carried out, a second electrode 300 to 1400 angstroms thick is formed with use of a metallic mask. The second electrode is made of a conductive transparent material such as ITO, $In_2O_3$, $SnO_2$, or ITN (a mixture of indium nitride and tin nitride).

Grooves 8 which provide access to the first electrode reach only to the surface of the first electrode 2 so that the second electrode 4 can be in contact with the first electrode 2.

After removing the bias applying circuit, the device integrated on a 10 cm×10 cm panel was irradiated with light of 100 mW/cm² (AM1). The characteristics obtained were:
open-circuit voltage: 12.618 V
fill factor: 0.672
short-circuit current: 79.710 mA
current density: 17.371 mA/cm²
efficiency: 9.82%

The effective curing action of the application of the reverse bias is attributed also to the transparent electrodes made of conductive transparent oxide provided on both sides of the semiconductor. That is, when the semiconductor is burned by the reverse bias voltage, a chemical reaction takes place between the transparent electrode and the semiconductor or insulator resulting in an insulating oxide product, silicon oxide for example.

With a device fabricated according to a process identical to that of the preceding FIG. 5 but without reverse bias curing, the following experimental data 1 were obtained, and without the hole filling process and without reverse bias curing, the following experimental data 2 were obtained:

|  | data 1 | data 2 |
|---|---|---|
| open-circuit voltage: | 11.30 V | 6.54 V |
| fill factor: | 0.626 | 0.368 |
| short-circuit current: | 79.4 mA | 75.69 mA |
| efficiency: | 8.16% | 3.48% |

As in the previous embodiment, only by filling defects of the semiconductor layer can the performance of the photovoltaic device be markedly improved.

The other important feature of the invention, which is not illustrated in the figure, is that a high yield can be obtained since the fluctuation of the characteristics is small among the finished products. For instance, 0.195 (X=9.63%) was obtained as the variance in efficiency from ten samples each 10 cm long×10 cm wide prepared according to the NEDO standard.

While the present invention has been described with reference to several preferred processes and embodiments thereof, many variations and modifications will now occur to those skilled in the art. It is our intent, therefore, to be limited solely by the scope of the appending claims and not by the specific embodiment disclosed herein. Examples of variations are as follows.

The semiconductor layer may be constituted with a multijunction structure in place of the single junction structure. Namely, the layer can be a laminate composed of a p-type semiconductor ($SixC_{l-x}$), an intrinsic amorphous silicon semiconductor, an n-type silicon semiconductor, a p-type semiconductor ($SixC_{l-x}$), an intrinsic semiconductor ($SixGe_{l-x}$), and n-type silicon semiconductor layer 300 to 1000 angstroms thick, wherein $0<X<$ e.g., X=0.5.

To scribe the grooves, the grooves can be formed all at once by irradiating with a laser beam extending in the lateral direction which is produced from an eximer laser through a cylindrical lens, if necessary, after expansion of the original beam.

The above technique according to the invention is applicable also to a light emitting semiconductor devices with double heterojunctions and a super lattice structure. As such devices, the applicant has disclosed some semiconductor devices in U.S. Pat. No. 4,527,179 and U.S. application Ser. No. 645,773.

The invention is advantageous also when applied to a diode array of an image sensor or a nonlinear element of a thin film display. In some applications, the reverse bias voltage circuit can be dispensed with or very simplified. For example, an active device can be cured by applying a reverse voltage to the source, drain, and/or gate electrodes.

What we claim is:
1. A semiconductor defect curing method for semiconductor devices having a plurality of semiconductor elements, within each of which is formed a semiconductor junction, said method comprising:
connecting a plurality of zener diodes in series with each other;
connecting the anode of one of each said zener diode to one side of the junction of a corresponding semiconductor element;
applying a reverse bias voltage to the plurality of zener diodes and to said plurality of semiconductor elements, the zener voltages and the reverse bias voltage being chosen so that the zener diode corresponding to each semiconductor element has its zener voltage less than the breakdown voltage of the corresponding semiconductor element.

2. The method of claim 1 wherein said semiconductor device is an array of solar cells.

3. The method of claim 2 wherein said semiconductor elements each comprise a semiconductor layer and a transparent oxide electrode formed thereon.

4. A semiconductor defect curing apparatus for semiconductor devices having a plurality of semiconductor elements, within each of which is formed a semiconductor junction, said apparatus comprising:

a plurality of zener diodes connected in series with each other;

a plurality of contacts adapted to make contact between the anode of one said zener diode to a corresponding semiconductor element;

a voltage supply for applying a reverse bias voltage to the plurality of zener diodes, the zener voltages and the reverse bias voltage being chosen so that the zener diode corresponding to each semiconductor element has its zener voltage less than the breakdown voltage of the corresponding semiconductor element.

* * * * *